United States Patent

Boleky

[15] 3,699,395

[45] Oct. 17, 1972

[54] SEMICONDUCTOR DEVICES INCLUDING FUSIBLE ELEMENTS

[72] Inventor: Edward Joseph Boleky, Cranbury, N.J.

[73] Assignee: RCA Corporation

[22] Filed: Jan. 2, 1970

[21] Appl. No.: 13

[52] U.S. Cl.............317/101, 317/234 L, 317/234 N, 317/235 F, 317/235 V, 337/1

[51] Int. Cl...............................................H01l 19/00

[58] Field of Search.......307/303; 317/235 D, 234 N, 317/101 CY, 101 A; 337/1, 417

[56] References Cited

UNITED STATES PATENTS

| | | | |
|---|---|---|---|
| 3,555,365 | 1/1971 | Forlani et al. | 317/101 |
| 3,564,354 | 2/1971 | Aoki et al. | 317/235 |
| 3,401,317 | 9/1968 | Gault | 317/234 |
| 3,377,513 | 4/1968 | Ashby et al. | 317/101 |
| 3,378,920 | 4/1968 | Cone | 29/625 |
| 3,028,659 | 4/1962 | Chow et al | 29/155.5 |

FOREIGN PATENTS OR APPLICATIONS

| | | | |
|---|---|---|---|
| 752,985 | 2/1967 | Canada | 337/1 |
| 1,529,672 | 3/1967 | France | 337/1 |

OTHER PUBLICATIONS

IBM Tech. Disclosure Bulletin, Shuttle Vol. 13, No. 1, June 1970

*Primary Examiner*—John W. Huckert
*Assistant Examiner*—William D. Larkinson
*Attorney*—Glenn H. Bruestle

[57] ABSTRACT

Information storing devices, such as read-only-memories, comprise an array of semiconductor components on a substrate, each component being connected into the array by first and second conductors, the first conductor being of a material well suited as an electrical conductor. e.g., aluminum, and the other well suited as a fuse, e.g., a highly doped semiconductor material. Preferably, the second conductor is disposed on a thermal insulating layer.

7 Claims, 7 Drawing Figures

INVENTOR
Edward J. Boleky

BY M.Y. Epstein
ATTORNEY

INVENTOR
Edward J. Boleky
BY
M.Y. Epstein
ATTORNEY

INVENTOR
Edward J. Boleky
BY M.Y. Epstein
ATTORNEY

SEMICONDUCTOR DEVICES INCLUDING FUSIBLE ELEMENTS

BACKGROUND OF THE INVENTION

This invention relates to semiconductor devices, and particularly to semiconductor devices of the type comprising an array of semiconductor components on a substrate, said devices having utility, for example, in logic or information storage systems.

Certain type of semiconductive devices comprise a plurality of semiconductor components, e.g., diodes, disposed on a substrate. The components are arrayed in an $x$–$y$ matrix by means of two crossed, orthogonal sets of connector strips, each component being disposed adjacent to an intersection of a pair of strips, and being electrically connected between the pair.

To encode the matrix, i.e., provide information to be stored therein, the relationship of selected ones of the components with the matrix is altered, e.g., the selected components are disconnected from the matrix. To this end, according to one prior art arrangement, each component is electrically connected to one of its connector strips by means of a fuse. Selected one of the components are disconnected from the matrix by causing a fusing, i.e., fuse blowing, current to pass through the selected components and the fuses in series therewith.

A disadvantage of this arrangement arises from the fact that the fuses serve the alternative roles as either fuses to be selectively opened, or as electrical connectors for the components remaining in the matrix. Using materials suitable as electrical connectors results, for a reason described hereinafter, in the resistance of the fuses being relatively low. This gives rise, in the prior art, of the need for comparatively large fusing currents. A problem with the use of large fusing currents is that, in some instances, the passage of the current through the semiconductor component in series with the fuse can result, prior to the burn-out of the fuse, in a change in characteristics of the semiconductor component which prevents fuse burn-out. For example, a large current can convert the PN junction of the component into a large resistance which immediately reduces the current to an amplitude less than the required fusing current. Thus, the semiconductor component remains in the matrix. Also, the need for high fusing currents requires the use of large voltages across the series combination of fuse and semiconductor component. The use of such large voltages, as known, can cause fusing currents to pass through other elements of the matrix which are electrically connected in parallel to the selected element. Thus, other elements of the matrix, intended to remain in the matrix, are disconnected therefrom.

DESCRIPTION OF THE PREFERRED EMBODIMENTS

The present invention is described in connection with semiconductor devices of the type having utility in the memory systems of computers, such devices being known as read-only-memories.

Figure 1:
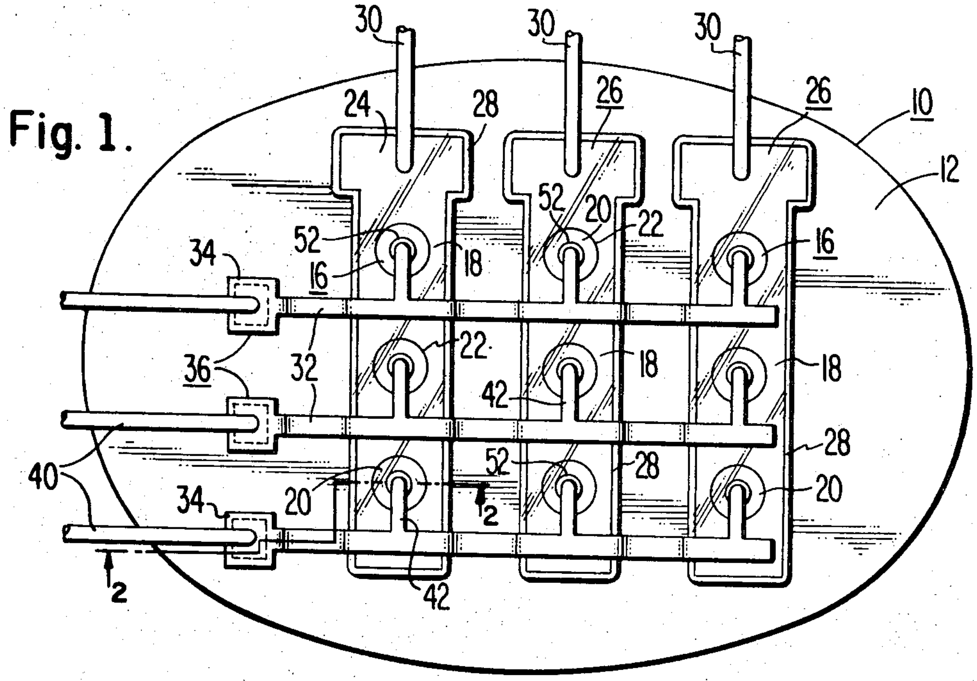
FIG. 1 is a plan view of a semiconductor device in accordance with the present invention.
Figure 2:
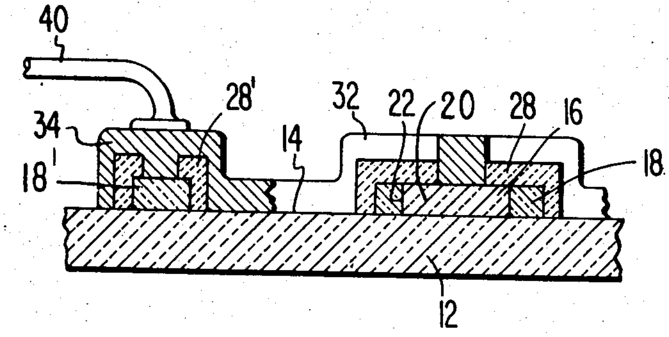
FIG. 2 is a section, on an enlarged scale, along line 2—2 of FIG. 1.

With reference to FIGS. 1 and 2, a read-only-memory device 10 is shown which comprises a flat substrate 12 of, in this embodiment, a dielectric material, e.g., sapphire. The substrate 12, depending upon the device being fabricated, can comprise any of several materials, e.g., metals, ceramics, semiconductors, or the like. On one surface 14 of the substrate 12 are a plurality of semiconductor components 16, diodes in the instant embodiment, arranged in an array of rows and columns.

Each diode 16 is an integral portion of an elongated strip 18 of a semiconductor material on the substrate surface 14. In this embodiment, the strips 18 comprise N conductivity type silicon. Circular regions 20 of the strips 18 are doped to P conductivity type, thus providing PN junctions 22 for the diodes 16.

The strips 18 comprise column connectors for the diodes 16, each strip 18 terminating in an enlarged portion 24 which forms part of a bonding pad 26. Covering each of the strips 18 and the enlarged portions 24 thereof is a layer 28 of an insulating material, e.g., silicon dioxide, silicon nitride, or the like. Fine wires 30 are connected to the bonding pads 26.

Crossing the strips 18, and being separated therefrom by the layer 28, are a plurality of metal strips 32, each of the strips 32 terminating in enlarged portions 34 which form part of bonding pads 36. Each pad 36 comprises a layer 18' of silicon, a covering layer 28' of the same material as the layer 28, and the metal portion 34. Fine wires 40 are connected to the bonding pads 36.

The metal strips 32 comprise row connectors for each of the diodes 16, and are connected to the diodes by means of fuses 42 connected to the strips 32 and connected to the P regions 20 of the diodes 16 through openings through the insulating layer 28.

The read-only-memory device 10 shown in FIGS. 1 and 2 is normally mounted within an envelope including terminal means which are connected to each of the fine wires 30 and 40. Envelopes suitable for this purpose are well known; accordingly, an example thereof is not provided.

Further details of read-only-memory devices, and uses thereof, are described in U.S. Pat. No. 3,377,513 issued to R. A. Ashby, et al. on Apr. 9, 1968.

The fabrication of the device 10 is as follows.

Figure 3:
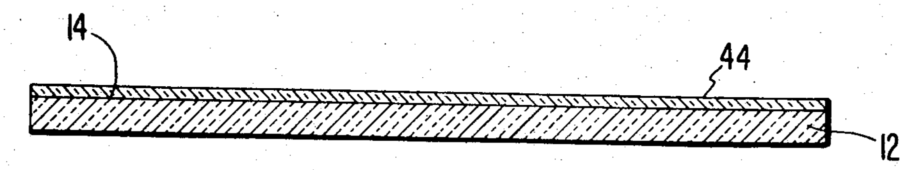
FIG. 3 is a sectional view of a workpiece substrate showing a step in the fabrication of the device shown in FIGS. 1 and 2.

Starting with a thin, flat substrate 12 of sapphire (FIG. 3), a thin layer 44 of N doped silicon is epitaxially grown on a surface 14 of the substrate. Means for epitaxially growing silicon on a dielectric substrate are known.

Figure 4:
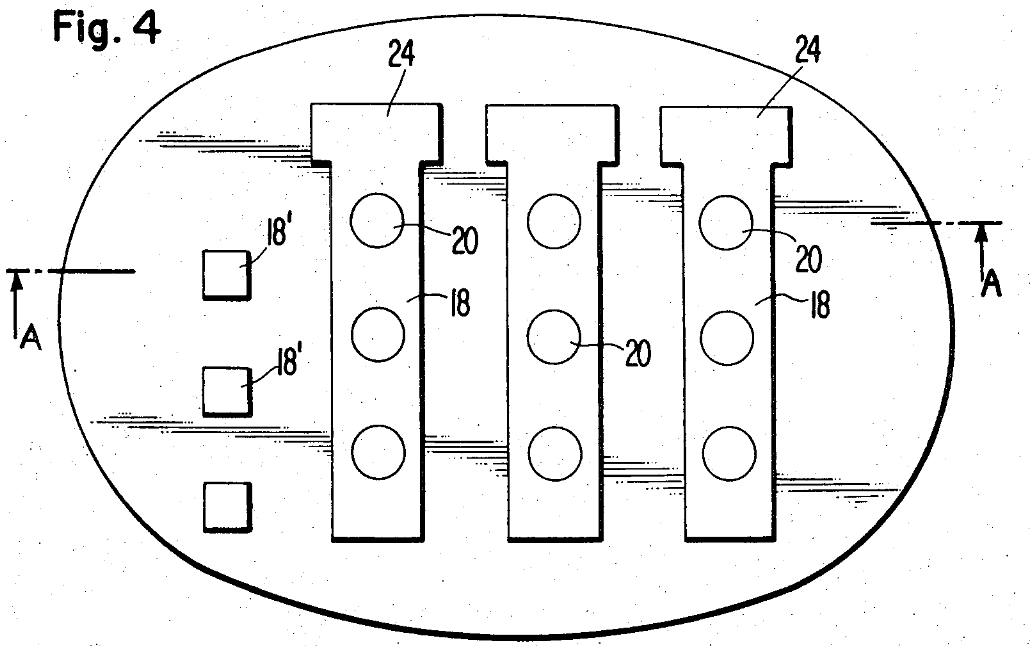
FIG. 4 is a plan view of the workpiece showing a subsequent step in the processing thereof.

Using standard masking and etching techniques, portions of the silicon layer 44 are then removed leaving a pattern (FIG. 4) of spaced longitudinally extending strips 18 and the elements 24 and 18' of the bonding pads 26 and 36 (FIG. 1), respectively.

Spaced circular portions 20 of each strip 18 are then converted to P conductivity type, using, e.g., standard masking and doping techniques.

Figure 5:
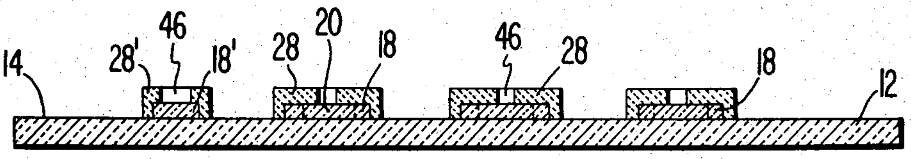
FIGS. 5 and 6 are central sections, looking in the direction of the arrows A of FIG. 4, of the workpiece showing still further steps in the processing thereof.

Thereafter, as illustrated in FIG. 5, the strips 18 and the bonding pad elements 18' are covered with layers 28 and 28', respectively, of an insulating material. In this embodiment, the layers 28 and 28' comprise silicon dioxide provided, for example, by thermally converting a surface portion of the silicon to the oxide, in accordance with known processes. Openings 46 are then selectively etched through the layers 28 and 28' to expose a surface portion of the P type portions 20 of the strips 18, and surface portions of the bonding pad elements 18', respectively.

Figure 6:
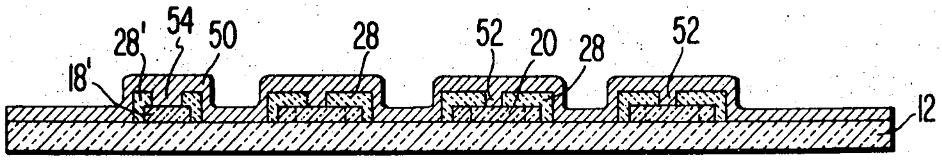

The entire surface of the workpiece is then coated (FIG. 6) with a layer 50 of metal, e.g., aluminum, gold, nickel, or the like, deposited, e.g., by an evaporation or sputtering process. Portions 52 of the metal layer 50 extend through the openings 46 through the insulating layer 28 and cover the previously exposed surface portions of the P type portions 20 of the strips 18. Also, portions 54 of the metal layer 50 extend through the openings 46 through the insulating layer 28' and cover the previously exposed surface portions of the bonding pad elements 18'.

Figure 7:
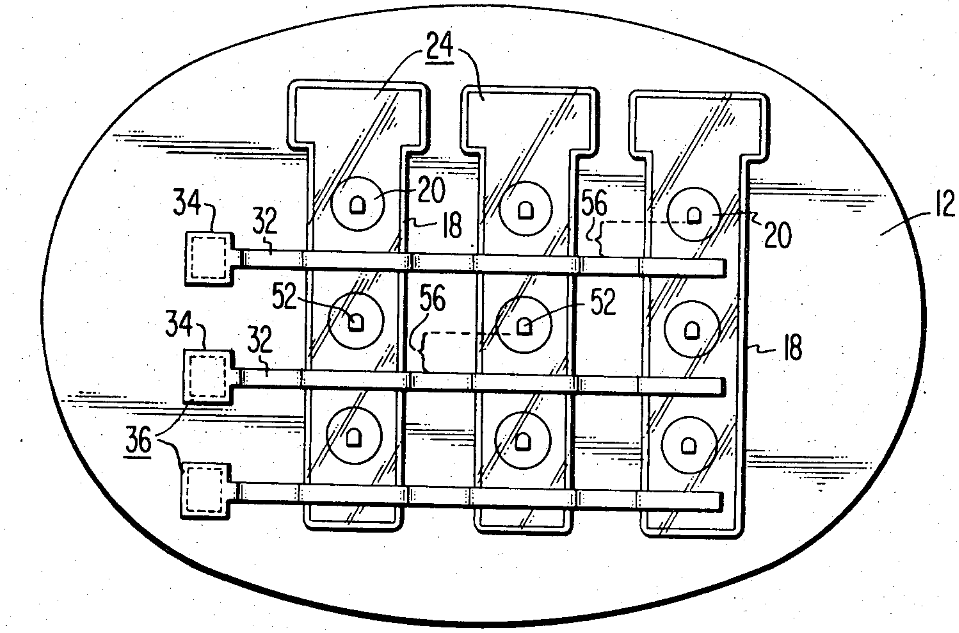
FIG. 7 is a plan view of the workpiece showing a still further step in the processing sequence.

Using known masking and etching techniques, portions of the metal layer 50 are then removed leaving a pattern (FIG. 7) of spaced laterally extending strips 32 each having an enlarged portion 34 forming part of the bonding pads 36, now completed. The metal portions 52, which extend through the layer 28 and into contact with the P regions 20 of the strips 18, remain, but are separated from the strips 32 by a gap 56.

To bridge the gaps 56, the entire surface of the workpiece is then coated with an appropriate fuse material, described hereinafter, as by an evaporation or sputtering process. Using known masking and etching techniques, portions of the fuse material layer are thereafter removed leaving the fuses 42 (FIG. 1) extending between and overlapping the various strips 32 and the metal portions 52. The fuses 42, in this embodiment, connect each diode into the matrix.

Connecting wires 30 and 40 are then bonded, as by known ultrasonic bonding techniques, to the bonding pads 26 and 36, respectively, and the workpiece is mounted with a suitable envelope.

After the completion of the above-described steps, either before or after the mounting of the workpiece within an envelope, the device is encoded, i.e., provided with stored information, by disconnecting selected ones of the diodes 16 from the matrix. This is accomplished by applying voltages between the pair of row connectors 32 and column connectors 18 between which the selected diodes are connected to cause fusing currents to pass through the fuses 42 associated with the selected diodes.

In accordance with the instant invention, the fusing current required to blow the fuses 42 is considerably less than that required in the prior art devices.

In the prior art, the fuses are of the same material as that of the connectors 32, e.g., aluminum or gold. The fusible characteristic of the fuses 42 is obtained by making the fuses of reduced cross section, i.e., of high resistance per unit length. A disadvantage of this arrangement, however, is that relatively high fusing currents are required. A reason for this is that owing to the high electrical conductivity of the metals used, the fuses 42 have to be of exceedingly small cross-section in order to provide the high electrical resistivity required to enable significant electrical resistance heating to occur. With known fabricating techniques, however, there is a lower limit of cross-sectional area beneath which accurate reproducibility of the fuses 42 from device to device is difficult to obtain. The problem with high conductivity materials, such as aluminum or the like, is that at this lower limit of cross-sectional area, the electrical resistance of these materials is still so low as to give rise to the need for high fusing currents.

In accordance with the instant invention, the connectors 32 are made of materials well suited as electrical connectors, and the fuses 42 are made of a different material well suited as a fuse.

The table below lists a number of materials, and gives a figure of merit F for each material, proportional to the current density required to melt a fuse 42 of the material. The figure of merit F is calculated from the equation:

$$F=(c \cdot t)^{1/2}$$

where:

$c$ is the electrical conductivity of the material in $(\mu\Omega\text{-cm})^{-1}$, and $t$ is the melting temperature of the material in ° C.

Also listed in the table is the sheet resistance ($R_s$) of each material for a layer of the material having a thickness of 1,000 A. In the table, N is the concentration of doping atoms/cm$^3$, either acceptor dopants ($N_a$) or donor dopants ($N_d$); the symbol + denotes polycrystalline material, and the symbol # denotes single crystal material.

TABLE

| Material | Rs | (Ohms Per Square) |
|---|---|---|
| Si(N=O) | $2.4 \times 10^{10}$ | $0.77 \times 10^{-4}$ |
| Ge(N=O) | $4.5 \times 10^{6}$ | $1.42 \times 10^{-3}$ |
| Si($N_d$=1 × $10^{20}$)+ | 170–85 | 0.91–1.29 |
| Si($N_d$=A1 × $10^{20}$)# | 85 | 1.29 |
| Ge($N_d$=A1 × $10^{20}$)+ | 85–40 | 1.08–1.53 |
| Ge($N_d$=A1 × $10^{20}$)# | 40 | 1.53 |
| Si($N_d$=A5 × $10^{20}$)+ | 25–50 | 1.68–2.38 |
| Si($N_d$=A5 × $10^{20}$)# | 25 | 2.38 |
| Ge($N_d$=A5 × $10^{20}$)+ | 30–15 | 1.77–2.5 |
| Ge($N_d$=A5 × $10^{20}$)# | 15 | 2.5 |
| Si($N_d$=A1 × $10^{21}$)+ | 26–13 | 2.34–3.31 |
| Si($N_d$=A1 × $10^{21}$)# | 13 | 3.31 |
| Pb | 2.2 | 3.90 |
| In | 0.9 | 3.97 |
| Sn | 1.1 | 4.53 |
| Cd | 0.7 | 6.87 |
| Zn | 0.6 | 8.50 |
| Cr | 1.3 | 12.1 |
| Pt | 1.1 | 12.95 |
| Ni | 0.7 | 14.5 |
| Al | 0.3 | 14.5 |
| Ti | 0.6 | 16.8 |
| Au | 0.24 | 21.1 |
| Ag | 0.16 | 24.3 |

An examination of the table reveals that metals, such as chrome, aluminum and gold, well suited for use as electrical connectors, by virtue of the low sheet resistance ($R_s$) thereof, are not best suited as fuses owing to the high current densities (high F) required to blow fuses of these materials. Best suited as fuses are the materials silicon, germanium, indium, lead, and tin.

Both indium and tin have relatively low melting temperatures. Although usable as fuses, the low melting temperatures of these materials render them somewhat impractical for use in semiconductor devices of the type hereindescribed, which are often processed, subsequent to the formation of the fuses 42, at temperatures in excess of the melting temperatures of these materials.

Lead is well suited as a fuse since both its figure of merit F and its sheet resistance Rs are low. Low sheet resistance is important to provide low device resistance in the case where the un-opened fuses 42 serve as connectors for the various components remaining in the array. The use of lead, however, does require some degree of special care to protect the fuses from damage, owing to the softness of lead, and further requires the use of careful processing to provide good adherence of the lead elements 42 to the underlying layer of silicon dioxide, or the like.

Intrinsic, or undoped silicon and germanium, either single-crystal or polycrystalline, have exceptionally low figures of merit F. Owing to the high sheet resistance Rs of these materials, however, they are unsuited for use in the hereindescribed devices. By suitably doping these materials, however, a compromise can be obtained between adequately low resistance, for suitability of the fuses 42 as electrical connectors, and adequately low fuse figure of merit, for low fusing currents. The particular doping selected depends upon the particular device being made.

In general, the silicon and germanium elements 42, either polycrystalline or single crystal, should be degenerately doped, i.e., doped with either acceptor or donor atoms at a concentration in excess of $1 \times 10^{20}$ atoms/cm$^3$. More specifically, fuses 42 of these materials having doping concentrations between $5 \times 10^{20}$ atoms/cm$^3$ to $2 \times 10^{21}$ atoms/cm$^3$ for silicon, and between $1 \times 10^{20}$ atoms/cm$^3$ to $5 \times 10^{20}$ atoms/cm$^3$ for germanium, are preferred. Owing to the high doping of the semiconductor elements 42, the contacts of the elements 42 with the metal strips 18 and the metal portions 52 of the diodes 16 are non-rectifying.

Silicon and germanium, either single crystal or polycrystal, are further well suited for use as fuses by virtue of the compatibility of these materials with, and the known techniques for applying these materials to, devices of the type herein described.

Also, while the characteristics of fuses made from silicon or germanium vary depending upon whether the materials are either single crystal or polycrystalline, the choice generally depends upon the device being made, i.e., upon the substrate material on which the fuses are deposited. Silicon, for example, can be epitaxially grown as a single crystal directly on sapphire, but only polycrystalline directly on silicon dioxide.

It has also been discovered that the fusing current for any given material is inversely related to the thermal conductivity and the thickness of the material on which the fuse is deposited.

In the instant embodiment, as described, the fuses 42 are deposited on an insulating layer 28, e.g., silicon oxide. The insulating layer 28, having a thickness in the order of, and preferably in excess of 5,000 A, has a low thermal conductivity, thereby further reducing the fusing current required to open-circuit the fuses 42.

In a specific embodiment the substrate 12 is of sapphire having a thickness of 10 mils. The silicon layers 18 and 18' have a thickness of 10,000 A, and are doped with phosphorous to a concentration of $1 \times 10^{20}$ atoms/cm$^3$. The P doped portions 20 of the semiconductor diodes are doped with boron to a concentration of $1 \times 10^{20}$ atoms/cm$^3$. The silicon dioxide layers 28 and 28' have a thickness of 5,000 A. The metal layer 34 comprises aluminum having a thickness of 10,000 A, or higher. The bonding pads 26 and 36 measure 3 by 3 mils.

The fuses 42, in this embodiment, are of lead and are 3,000 A. thick, 0.4 mils wide, and 13.3 mils long. The current required to blow these fuses, at an ambient temperature of 30° C., is 145 milliamperes.

In another embodiment, identical to the above-described embodiment with the exception of the fuses 42, the fuses 42 are of polycrystalline silicon doped to a concentration of $5 \times 10^{10}$ atoms/cm$^3$, and are 2,000 A. thick, 0.4 mils wide, and 2.0 mils long. The fusing current for these fuses, at an ambient temperature of 30° C., is 55 milliamperes. In the fuse-opening operation, it is noted, current is passed through the selected fuses 42 via the connectors 18 and 32. The connectors 18, also of a semiconductor material are not significantly heated owing to the low resistance thereof occasioned by the large cross section of the strips 18. In the instant embodiment, for example, the strips 18 are 10,000 A. thick and 2 mils wide.

In prior art devices of the type described, but using aluminum fuses 42 of 1,000 A. thickness, 0.4 mils width, and 2.0 mils length, the fusing current, at an ambient temperature of 30° C., is 275 milliamperes.

While the invention has been described in connection with a semiconductor device comprising a matrix of diodes, with the fuses 42 connected in series with the diodes, the invention has utility with various other devices. For example, the fuses 42 can be connected in parallel with the semiconductor components, diodes, transistors, or the like, thus being effective, when not open-circuited or blown, of shorting the components out of the matrix. Fusing or open-circuiting the fuses 42 thus, in this embodiment, serves to electrically "connect," rather than "disconnect," the components into the circuit. In still other embodiments, the semiconductor components and fuses are so connected that open-circuiting the fuses 42 neither "connects" nor "disconnects" the semiconductor components from the matrix, but simply varies the electrical characteristics of the components in a manner to distinguish these components from components associated with unblown fuses. Examples of devices of this latter type will be apparent to workers skilled in the art.

I claim:

1. A semiconductor device comprising:

a substrate, an array of semiconductor components on said substrate, each of said components being electrically associated with said array by means of first, seconds, and third connectors, said second and third connectors being serially connected, said second connectors being of a material having a lower fuse figure of merit and a higher electrical resistivity than the material of said third connectors, said second connectors being connected into said array by means of non-rectifying contacts and being formed of single conductivity type doped silicon or doped germanium, and selected ones of said second connectors being open-circuited.

2. A device as in claim 1 wherein said third connectors are formed of aluminum, gold, or nickel.

3. A device as in claim 1 wherein said first connectors are formed of silicon.

4. A device as in claim 1 wherein said first connectors are formed of doped silicon, said second connectors are formed of doped silicon, said third connectors are formed of aluminum, and said second connectors have a smaller cross-sectional area than said first connectors.

5. A device as in claim 1 including:

a layer of a thermal and electrical insulating material covering a portion of each of said first connectors, and different ones of said second connectors are disposed on different ones of said layers.

6. A semiconductor device comprising:

a substrate, an array of components on said substrate, and a plurality of fuses associated with various ones of said components by means of non-rectifying contacts, said fuses being of doped silicon or doped germanium of single conductivity type, and, connecting means for supplying a current to selected ones of said fuses of sufficient magnitude to open circuit said selected ones of said fuses.

7. A semiconductor device as in claim 6 wherein said fuses are of silicon.

* * * * *